United States Patent
Gebuhr et al.

(10) Patent No.: US 9,224,931 B2
(45) Date of Patent: Dec. 29, 2015

(54) METHOD FOR PRODUCING AN OPTOELECTRONIC SEMICONDUCTOR COMPONENT

(75) Inventors: Tobias Gebuhr, Regensburg (DE); Hans-Christoph Gallmeier, Regensburg (DE); Andreas Weimar, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 253 days.

(21) Appl. No.: 13/820,773

(22) PCT Filed: Aug. 29, 2011

(86) PCT No.: PCT/EP2011/064836
§ 371 (c)(1),
(2), (4) Date: Jul. 11, 2013

(87) PCT Pub. No.: WO2012/031932
PCT Pub. Date: Mar. 15, 2012

(65) Prior Publication Data
US 2014/0131739 A1    May 15, 2014

(30) Foreign Application Priority Data

Sep. 7, 2010   (DE) .......................... 10 2010 044 560

(51) Int. Cl.
*H01L 33/00*   (2010.01)
*H01L 33/62*   (2010.01)
(Continued)

(52) U.S. Cl.
CPC ................ *H01L 33/62* (2013.01); *H01L 24/18* (2013.01); *H01L 24/24* (2013.01); *H01L 33/56* (2013.01);
(Continued)

(58) Field of Classification Search
CPC ............ H01L 31/02322; H01L 33/483; H01L 25/167
See application file for complete search history.

(56) References Cited

U.S. PATENT DOCUMENTS 8,860,062 B2 * 10/2014 Schneider et al. ............... 257/98
2005/0242355 A1 * 11/2005 Guenther et al. ............... 257/82
(Continued)

FOREIGN PATENT DOCUMENTS

DE   10 2006 015 115 A1   10/2007
DE   10 2008 049 069 A1   4/2010
(Continued)

OTHER PUBLICATIONS

The Japanese Examination Report dated Mar. 4, 2014 for corresponding Japanese Application No. 2013-527542.
(Continued)

*Primary Examiner* — Benjamin Sandvik
(74) *Attorney, Agent, or Firm* — DLA Piper LLP (US)

(57) ABSTRACT

A method of producing a component including providing a carrier having a top, an underside, and at least one connection area, applying an optoelectronic component to the top, wherein the optoelectronic component has a contact area facing away from the carrier, applying insulating material to the contact and connection areas, wherein the insulating material is free of foreign particles, applying an insulating layer to exposed places of the insulating material, optoelectronic component and carrier, wherein the insulating layer includes foreign particles in a predefinable concentration, removing the insulating layer in a region above the contact and/or connection areas, to produce openings, removing the insulating material in a region above the contact and connection areas, thereby producing at least two openings in the insulating material, and arranging conductive material on the insulating layer and at least in places in the openings, wherein conductive material conductively connects the contact and connection areas.

10 Claims, 6 Drawing Sheets

(51) Int. Cl.
  *H01L 23/00* (2006.01)
  *H01L 33/56* (2010.01)
  *H01L 25/16* (2006.01)
  *H01L 33/50* (2010.01)
  *H01L 33/60* (2010.01)

(52) U.S. Cl.
  CPC .............. *H01L 25/167* (2013.01); *H01L 33/50* (2013.01); *H01L 33/60* (2013.01); *H01L 2224/18* (2013.01); *H01L 2924/01005* (2013.01); *H01L 2924/01023* (2013.01); *H01L 2924/01082* (2013.01); *H01L 2924/12041* (2013.01); *H01L 2933/0066* (2013.01); *H01L 2933/0091* (2013.01)

(56) References Cited

U.S. PATENT DOCUMENTS

| | | | |
|---|---|---|---|
| 2008/0121911 | A1 | 5/2008 | Andrews et al. |
| 2008/0128733 | A1 | 6/2008 | Yoo |
| 2009/0057699 | A1* | 3/2009 | Basin et al. .............. 257/98 |
| 2009/0127573 | A1* | 5/2009 | Guenther et al. .............. 257/98 |
| 2009/0207004 | A1 | 8/2009 | Ziska et al. |
| 2010/0320479 | A1* | 12/2010 | Minato et al. .............. 257/88 |
| 2011/0024784 | A1 | 2/2011 | Song |

FOREIGN PATENT DOCUMENTS

| | | |
|---|---|---|
| EP | 2 216 834 A1 | 8/2010 |
| JP | 2006-324667 | 11/2006 |
| JP | 2009-43764 | 2/2009 |
| JP | 2009-130237 | 6/2009 |
| JP | 2009-531839 | 9/2009 |
| JP | 2009-531893 | 9/2009 |
| JP | 2010-40894 | 2/2010 |
| JP | 2012-503866 | 2/2012 |
| JP | 2013-535847 | 9/2013 |
| WO | 2009/145502 A2 | 12/2009 |

OTHER PUBLICATIONS

English translation of a Japanese Decision to Grant a Patent mailed Oct. 7, 2014 for Japanese Application No. 2013-527542.

English translation of corresponding Office Action dated Feb. 28, 2015 of Chinese Application No. 201180043207.1.

* cited by examiner

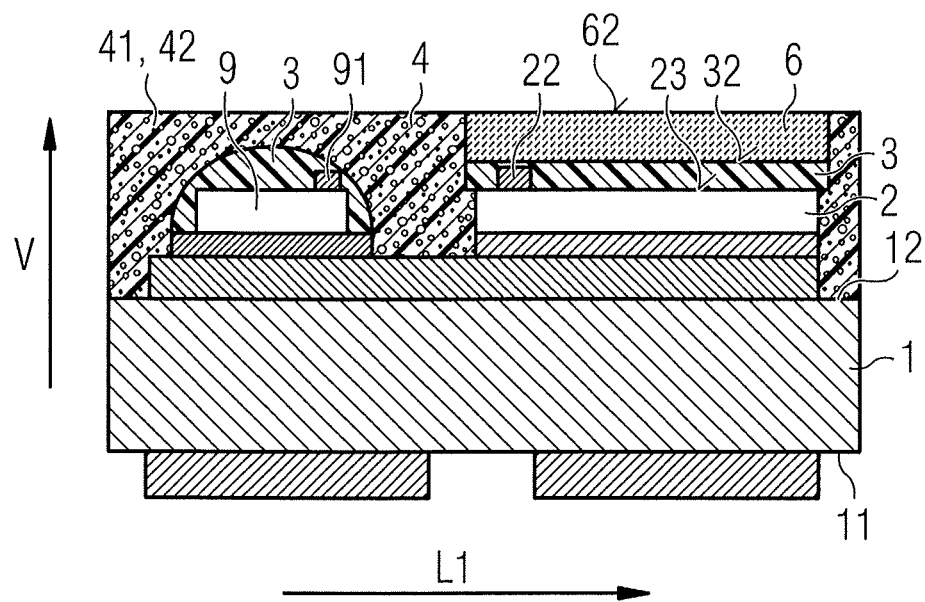
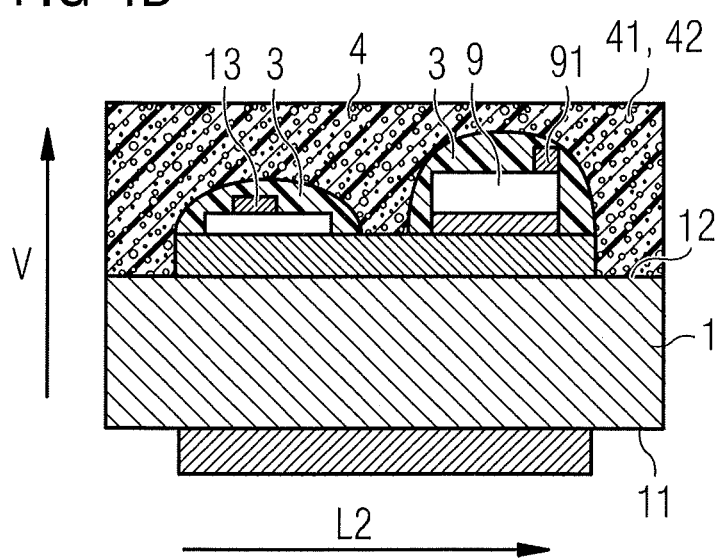

METHOD FOR PRODUCING AN OPTOELECTRONIC SEMICONDUCTOR COMPONENT

RELATED APPLICATIONS

This application is a §371 of International Application No. PCT/EP2011/064836, with an international filing date of Aug. 29, 2011 (WO 2012/031932 A1, published Mar. 15, 2012), which is based on German Patent Application No. 10 2010 044 560.6, filed Sep. 7, 2010, the subject matter of which is incorporated herein by reference.

TECHNICAL FIELD

This disclosure relates to a method of producing an optoelectronic semiconductor component and also an optoelectronic semiconductor component.

BACKGROUND

There is a need to provide a method of producing an optoelectronic semiconductor component which is material-preserving for electrical contacts of the later semiconductor component.

SUMMARY

We provide a method of producing an optoelectronic semiconductor component, including a) providing a carrier having a top side, an underside situated opposite the top side, and at least one connection area arranged at the top side; b) applying at least one optoelectronic component to the top side, wherein the optoelectronic component has at least one contact area facing away from the carrier; c) applying an electrically insulating material to the contact area and the connection area, wherein the electrically insulating material is free of foreign particles of a filler; d) applying an electrically insulating layer to exposed places of the electrically insulating material, of the optoelectronic component and of the carrier, wherein the electrically insulating layer includes foreign particles of the filler with a predefinable concentration; e) removing the electrically insulating layer in a region above the contact area and/or the connection area, to thereby produce openings; f) removing at least the electrically insulating material in a region above the contact area and the connection area, thereby producing at least two openings in the electrically insulating material; and g) arranging electrically conductive material on the electrically insulating layer and at least in places in the openings, wherein the electrically conductive material electrically conductively connects the contact area to the connection.

We also provide an optoelectronic semiconductor component, including a carrier having a top side, an underside situated opposite the top side, and also at least one connection area arranged at the top side; at least one optoelectronic component arranged at the top side and which has at least one contact area facing away from the carrier; an electrically insulating material applied on a radiation passage area of the optoelectronic component, wherein the electrically insulating material is free of foreign particles of a filler; an electrically insulating layer directly adjoining the electrically insulating material in a lateral direction, wherein the electrically insulating layer includes foreign particles of the filler with a predefinable concentration and openings in the region above the contact area and/or the connection area; and a material opening introduced into the electrically insulating material above the contact area, wherein the contact area, in the region of the material opening, is free of the electrically insulating material at least in places.

We further provide an optoelectronic semiconductor component, including a carrier having a top side, an underside situated opposite the top side, and at least one connection area arranged at the top side; at least one optoelectronic component arranged at the top side and having at least one contact area facing away from the carrier; an electrically insulating material applied on a radiation passage area of the optoelectronic component, wherein the electrically insulating materials is free of foreign particles of a filler; an electrically insulating layer directly adjoining the electrically insulating material in a lateral direction, wherein the electrically insulating layer comprises foreign particles of the filler with a predefinable concentration, marginally partly or completely encloses the electrically insulating material and/or the optoelectronic components and includes openings in the region above the contact area and/or the connection area; and a material opening introduced into the electrically insulating material above the contact area, wherein the contact area, in the region of the material opening, is free of the electrically insulating material at least in places.

BRIEF DESCRIPTION OF THE DRAWINGS

FIG. 4A show individual manufacturing steps for producing an example by our method.

FIG. 4B show individual manufacturing steps for producing an example by our method.

DETAILED DESCRIPTION

Figure 1A:
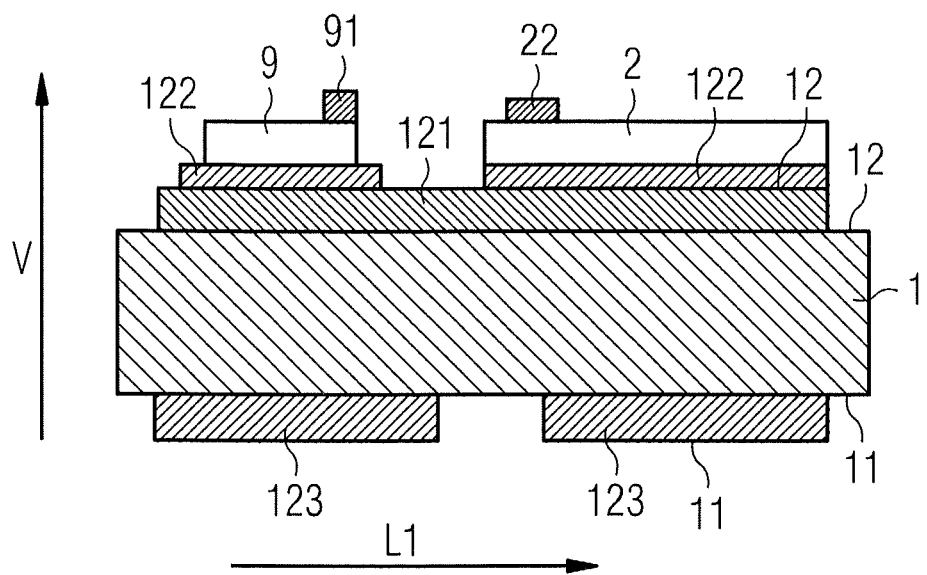
FIG. 1A show individual manufacturing steps for producing an example by our method.

Our method may include a first step a) which involves providing a carrier having a top side and an underside situated opposite the top side of the carrier. The carrier can be a circuit board or a metallic leadframe. It is likewise possible for the carrier to be flexible and as a film, for example. The carrier can be formed with an electrically conductive material, for example, a metal and/or an electrically insulating material, for example, a thermosetting plastic material, thermoplastic material, and/or a ceramic material. If the carrier is formed with an electrically insulating material, then the carrier can have electrical conductor tracks and contact areas at the top side and/or the underside.

A respective area formed by a part of the outer area of the carrier is formed at the top side and the underside. The area at the underside is the part of the outer areas of the carrier which faces a contact carrier, for example, a circuit board in the mounted state of the carrier. By way of example, the area at the underside of the carrier is a mounting area which can serve for the mounting of the later semiconductor component on the contact carrier. Furthermore, the carrier has at least one connection area arranged at the top side of the carrier.

A next step b) may involve applying at least one optoelectronic component to the top side of the carrier, wherein the optoelectronic component has at least one contact area facing away from the carrier. The at least one contact area serves to electrically contact the optoelectronic component and is formed with an electrically conductive material, for example, a metal. By way of example, the connection area and the optoelectronic component are arranged alongside one another in a lateral direction. In this context, "lateral" means a direction parallel to the main extension direction of the carrier. By way of example, the optoelectronic component is bonded, soldered or electrically conductively adhesively bonded by an outer area facing away from the contact area on a contact place of the carrier. The optoelectronic component can be, in particular, a radiation-receiving or a radiation-emitting semiconductor chip. By way of example, the semiconductor chip is a luminescence diode chip, that is to say a light-emitting diode chip or a laser diode chip.

A next step c) may involve applying an electrically insulating material to the contact area and the connection area. Preferably, neither a gap nor an interruption forms between the electrically insulating material, on the one hand, and the contact area and the connection area, on the other hand. By way of example, the electrically insulating material completely covers the connection area and/or the contact area at the outer areas thereof facing away from the carrier. Furthermore, the electrically insulating material can also cover side areas of the contact area and of the connection area.

The electrically insulating material is free of foreign particles of a filler. In this context, "free of foreign particles of a filler" means that the foreign particles of the filler are not introduced in a targeted manner into the electrically insulating material from outside. It is at most possible that, in a manner governed by production, for example, residues of the foreign particles of the filler are still situated in the electrically insulating material. Preferably, however, the concentration of the foreign particles is present in such a low concentration in the electrically insulating material that the foreign particles have no adverse physical and/or chemical effects on the properties of the electrically insulating material.

A next step d) may involve applying an electrically insulating layer to exposed places of the electrically insulating material, of the optoelectronic component and of the carrier. Preferably, the electrically insulating layer covers the electrically insulating material and the optoelectronic component in a positively locking manner at these places. By way of example, exposed places of the carrier at the top side thereof are also covered partly or completely by the electrically insulating layer.

The electrically insulating layer comprises foreign particles of the filler with a predefinable concentration. That is to say that the foreign particles of the filler are introduced in a targeted manner into the material of the electrically insulating layer from outside. If, for example, in a manner governed by production or on account a diffusion of the foreign particles from the electrically insulating layer into the electrically insulating material, the electrically insulating material likewise comprises foreign particles of the filler, preferably the concentration of the foreign particles of the filler in the electrically insulating material is negligible in comparison with the concentration of the foreign particles of the filler in the electrically insulating layer.

A next step e) may involve removing at least the electrically insulating material in the region above the contact area and the connection area, thereby producing at least two openings in the electrically insulating material. The openings extend in each case in a vertical direction completely through the electrically insulating material, wherein the contact and connection areas are free of the electrically insulating material at least in places. In this context, "vertical direction" means a direction perpendicular to the lateral direction. By way of example, the openings have at least one side area. The at least one side area of the opening can be formed by the electrically insulating material at least in places.

A next step f) may involve arranging electrically conductive material on the electrically insulating layer and at least in places in the openings, wherein the electrically conductive material electrically conductively connects the contact area to the connection area. That is to say that the electrically conductive material electrically conductively connects the optoelectronic component to the connection area of the carrier and in this case runs between the optoelectronic component and the connection area at least in places at an outer side of the electrically insulating layer facing away from the carrier. In this case, the electrically conductive material can be applied in places directly on an outer area of the electrically insulating layer. By way of example, the electrically conductive material is formed with a metal or an electrically conductive adhesive. Preferably, an electrically conductive connection between the optoelectronic component and the connection area of the carrier is formed completely by the electrically conductive material. By way of example, the openings are completely filled with the electrically conductive material.

The first step a) may involve providing a carrier having a top side, an underside situated opposite the top side of the carrier and also at least one connection area arranged at the top side of the carrier. The next step b) may involve applying at least one optoelectronic component to the top side of the carrier, wherein the optoelectronic component has at least one contact area facing away from the carrier. The next step c) may involve applying an electrically insulating material to the contact area and the connection area, wherein the electrically insulating material is free of foreign particles of a filler. The further step d) may involve applying an electrically insulating layer to exposed places of the electrically insulating material, of the optoelectronic component and of the carrier, wherein the electrically insulating layer comprises foreign particles of the filler with a predefinable concentration. The next step e) may involve removing at least the electrically insulating material in the region above the contact area and the connection area, thereby producing at least two openings in the electrically insulating material. The next step f) may involve arranging electrically conductive material on the electrically insulating layer and at least in places in the openings, wherein the electrically conductive material electrically conductively connects the contact area to the connection area.

In this case, the method of producing an optoelectronic semiconductor component is based on the insight, inter alia, that when exposing electrical contacts of the optoelectronic component by removing an electrically insulating layer comprising foreign particles of a filler with a predefinable concentration, after the electrically insulating layer has been removed, residues of the foreign particles of the filler can still remain at contact areas of the contacts. The residues of the foreign particles of the filler remaining on the contact areas can lead to a reduction in an electrical contact-connectability of the optoelectronic component. Furthermore, the contact areas of the optoelectronic component can be damaged by the residual foreign particles of the filler.

Thus, to provide a method of producing an optoelectronic semiconductor component in which damage to the electrical contacts of the later optoelectronic component can be avoided and at the same time the electrical contact-connectability is improved, the method described here makes use of the concept, inter alia, of applying an electrically insulating material to the electrical contacts of the optoelectronic component, wherein the electrically insulating material is free of foreign particles of a filler. In a further step, the electrically insulating layer is applied to exposed places of the electrically insulating material, wherein the electrically insulating layer comprises the foreign particles of the filler with the predefinable concentration. In other words, the electrically insulating material free of the foreign particles of the filler is arranged between the electrical contacts and the electrically insulating layer. That is to say that the contact areas of the electrical contacts of the optoelectronic component are in direct contact only with the electrically insulating material. In other words, during the exposure of the electrical contacts, the electrically insulating material serves as a spacer between the foreign particles and the electrical contacts. Direct contact between the electrical contacts and foreign particles of the filler is therefore avoided. If the electrically insulating material is then removed in the region above the electrical contacts, it is possible to minimize residues of the foreign particles of the filler that remain after the removal on the contact areas. As a result, during the method it is possible to avoid damage to the electrical contacts of the optoelectronic component, as a result of which not only does the lifetime of the later optoelectronic semiconductor component increase, but it is also possible, for example, to increase an optical output power of the later semiconductor component.

The electrically insulating material and the electrically insulating layer may comprise an identical material. By way of example, the electrically insulating layer and the electrically insulating material are formed with the identical material apart from the foreign particles of the filler. This advantageously avoids, for example, detachment of the electrically insulating layer from the electrically insulating material in a lateral direction since, apart from the foreign particles of the filler, mutually adjoining interfaces of the electrically insulating layer and of the electrically insulating material have properties which are as similar as possible. By way of example, the coefficients of thermal expansion of the electrically insulating material and of the electrically insulating layer are matched to one another.

The electrically insulating layer may be removed in the region above the contact area and/or the connection area, whereby the openings are produced. By way of example, the electrically insulating layer completely covers all exposed places of the electrically insulating material and of the optoelectronic component. For example, all exposed places at the top side of the carrier are likewise completely covered by the electrically insulating layer. The openings then extend in a vertical direction both through the electrically insulating layer and through the electrically insulating material contiguously and continuously. Side areas of the openings are then formed both by the electrically insulating material and by the electrically insulating layer.

The electrically insulating layer may contain at least one luminescence conversion material. The luminescence conversion material serves to at least partly convert electromagnetic radiation generated primarily within the optoelectronic component into electromagnetic radiation having a different wavelength.

Before step d), the electrically insulating material may be applied to a radiation passage area of the optoelectronic component at least in places, wherein the electrically insulating material is radiation-transmissive. For example, the electrically insulating material is transparent. Via the radiation passage area, electromagnetic radiation generated within the optoelectronic component, for example, is coupled out from the optoelectronic component or electromagnetic radiation entering into the optoelectronic component through the radiation passage area is detected by the optoelectronic component. "Radiation-transmissive" means in particular, that the electrically insulating material is transmissive to electromagnetic radiation at least to the extent of 80%, preferably to the extent of more than 90%. By way of example, the electrically insulating layer directly adjoins the electrically insulating material in a lateral direction. That can mean that the electrically insulating layer marginally partly or completely encloses the electrically insulating material and/or the optoelectronic component.

Subsequently and before step d), at least one conversion layer may be applied to an outer area of the electrically insulating material facing away from the optoelectronic component. Preferably, the optoelectronic component and the conversion layer overlap at least in places in a vertical direction. In this context, "overlap" means that the mathematical projections of the optoelectronic component and the conversion layer onto an imaginary plane perpendicular to the vertical direction are congruent at least in places. The conversion layer serves to at least partly convert electromagnetic radiation generated primarily within the optoelectronic component into radiation having a different wavelength.

The electrically insulating layer is radiation-reflective or radiation-absorbent and the electrically insulating layer is applied to exposed places of the optoelectronic component, of the electrically insulating material and the conversion layer. "Radiation-reflective" means, in particular, that the electrically insulating layer is reflective to electromagnetic radiation impinging on it at least to the extent of 80%, preferably to the extent of more than 90%. By way of example, the electrically insulating layer appears white to an external observer. By way of example, for this purpose, radiation-reflective particles are introduced into the electrically insulating layer, the particles, for example, being formed with at least one of the materials $TiO_2$, $BaSO_4$, $ZnO$ or $Al_xO_y$, or containing one of the materials mentioned. For example, the radiation-reflective particles are introduced into the electrically insulating layer in a concentration of at least 20% by weight and at most 50% by weight, for example 30% by weight. In the case of a radiation-absorbent electrically insulating layer, the electrically insulating layer can appear black or colored to an external observer. For example, carbon black particles are then introduced into the electrically insulating layer.

An outer area of the conversion layer facing away from the optoelectronic component remains free of the electrically insulating layer. "Free" means that the outer area of the conversion layer facing away from the optoelectronic component is not covered by the electrically insulating layer nor is it disposed downstream of the conversion layer in a vertical direction. The radiation can therefore emerge from the conversion layer in an unimpeded manner without impinging on the electrically insulating layer. It is at most possible that material residues of the electrically insulating layer may still be situated on the outer area of the conversion layer in a manner governed by production, but the material residues cover the outer area at most to the extent of 10%, preferably at most 5%.

The conversion layer may be removed in the region above the contact area, whereby at least one of the openings is produced. In other words, the opening extends in a vertical direction continuously and contiguously both through the conversion layer and through the electrically insulating material. By way of example, the side area of the opening above the contact area is completely formed by the conversion layer and the electrically insulating material.

In a vertical direction, the conversion layer may terminate flush with the electrically insulating layer. That is to say that neither a gap nor an interruption forms between the conversion layer and the electrically insulating layer in a lateral direction. By way of example, the conversion layer and the electrically insulating layer together form a continuous and contiguous plane. Preferably, the conversion element is externally visible and appears colored, for example, to an external observer.

Before step c), at least one electronic element at the top side of the carrier may be arranged at the carrier in a manner spaced apart from the optoelectronic component in a lateral direction, wherein, after the electronic element has been arranged at the carrier, first the electrically insulating material is applied to exposed places of the electronic element and the electrically insulating layer is subsequently applied to exposed places of the electrically insulating material. For example, contact is made with the electronic element in the same way as with the optoelectronic component. That is to say that contact is then made with the electronic element likewise via an opening introduced into the electrically insulating material and/or the electrically insulating layer and in which an electrically conductive material is arranged at least in places. By way of example, the electronic element contains or is a protective circuit against damage caused by electrostatic charging (also referred to as an ESD protective circuit).

By way of example, the electronic element, apart from a possible opening serving for contact-making, is covered by the electrically insulating material completely and in a positively locking manner. If the electrically insulating material is likewise covered by the electrically insulating layer in a positively locking manner to an external observer, for example, the electronic element can be completely hidden and/or covered by the electrically insulating layer.

Furthermore, we also provide an optoelectronic semiconductor component.

By way of example, the optoelectronic semiconductor component can be produced by the method described here, as has been described in conjunction with one or more of the examples mentioned above. That is to say that the features implemented for the method described here are also disclosed for the optoelectronic semiconductor component described here, and vice versa.

The optoelectronic semiconductor component may comprise a carrier having a top side, an underside situated opposite the top side of the carrier, and also at least one connection area arranged at the top side.

The optoelectronic semiconductor component may comprise at least one optoelectronic component arranged at the top side of the carrier and which has at least one contact area facing away from the carrier.

The optoelectronic semiconductor component may comprise an electrically insulating material applied on a radiation passage area of the optoelectronic component, wherein the electrically insulating material is free of foreign particles of a filler.

The optoelectronic semiconductor component may comprise an electrically insulating layer directly adjoining the electrically insulating material in a lateral direction, wherein the electrically insulating layer comprises foreign particles of the filler with a predefinable concentration.

The optoelectronic semiconductor component may comprise a material opening introduced into the electrically insulating material above the contact area. By way of example, the material opening is delimited in a lateral direction by at least one side area of the material opening. The side area can be completely formed by the electrically insulating layer. Preferably, the material opening extends in a vertical direction continuously through the electrically insulating material.

The contact area, in the region of the material opening, may be free of the electrically insulating material at least in places. That is to say that the contact area and the material opening may overlap one another at least in places in a vertical direction.

At least one conversion layer may be applied to an outer area of the electrically insulating material facing away from the optoelectronic component, wherein the electrically insulating layer is radiation-reflective or radiation-absorbent and an outer area of the conversion layer facing away from the carrier is free of the electrically insulating layer.

By way of example, the electrically insulating layer completely borders both the conversion layer and the optoelectronic component in a lateral direction. By way of example, the electrically insulating layer covers side areas of the conversion layer and exposed places of the optoelectronic component and of the carrier completely and in a positively locking manner.

A layer opening introduced into the conversion layer may be, in a vertical direction, at least in places congruent with the material opening introduced into the electrically insulating material, wherein the layer opening and the material opening together form an opening.

A further opening may be introduced above the connection area in the electrically insulating layer and the electrically insulating material, wherein the connection area is free of the electrically insulating material at least in places.

The optoelectronic semiconductor component may comprise an electrically conductive material arranged in places at a side of the electrically insulating layer facing away from the carrier and at least in places in the openings and electrically conductively connects the contact area to the connection area.

The method described here and also an optoelectronic semiconductor component described here are explained in greater detail below on the basis of examples and the associated figures.

In the examples and the figures, identical or identically acting constituent parts are in each case provided with the same reference signs. The elements illustrated should not be regarded as true to scale. Rather, individual elements may be illustrated with an exaggerated size to afford a better understanding.

FIG. 1A shows steps a) and b) of our method, wherein first a carrier 1 having a top side 12 and an underside 11 situated opposite the top side 12 of the carrier 1 is provided. For example, the carrier 1 is formed with a ceramic material. Electrical conductor tracks 121 and 123 of the carrier 1 form in places the areas at the top side 12 and the underside 11 of the carrier 1. First, an electrical contact layer 122 is applied on an outer area of the conductor track 121 facing away from the underside 11 of the carrier 1. An optoelectronic component 2 is applied to the electrical contact layer 122. The optoelectronic component 2 has a contact area 22 facing away from the carrier 1. The optoelectronic component 2 can be a radiation-emitting semiconductor chip that emits ultraviolet radiation or visible light. An electronic element 9 is applied on the contact layer 122 in a manner spaced apart from the optoelectronic component 2 in a lateral direction L1. The electronic element 9 has a contact area 91 facing away from the carrier 1. By way of example, electrical contact can be made both with the electronic element 9 and with the optoelectronic component 2 via the electrical conductor track 123 by a plated-through hole. By way of example, such a plated-through hole, proceeding from the top side 12 of the carrier 1, extends in the direction of the underside 11 of the carrier completely through the carrier 1. By way of example, a later semiconductor component 100 is surface-mountable with such a plated-through hole.

Figure 1B:
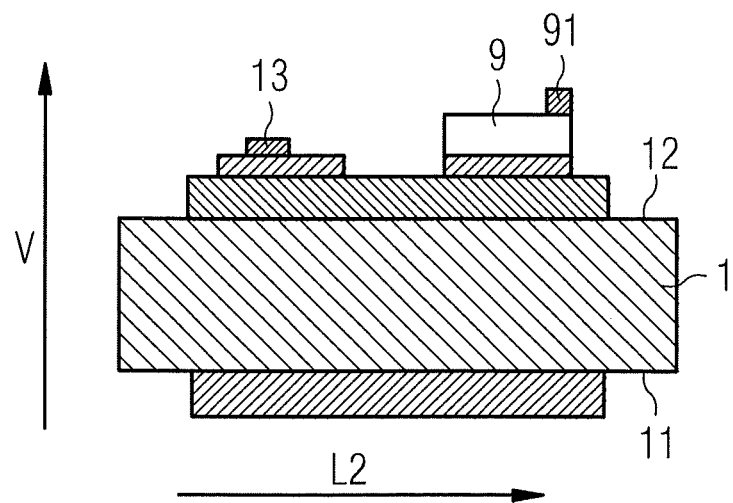
FIG. 1B shows individual manufacturing steps for producing an example by our method.

FIG. 1B shows the carrier 1 and the electronic element 9 along a lateral direction L2. The lateral directions L1 and L2 span an imaginary plane running parallel to a main extension plane of the carrier 1. In this case, the lateral directions L1 and L2 run perpendicular to one another within the plane. FIG. 1B illustrates that a connection area 13 is applied in a manner spaced apart from the electronic element 9 in a lateral direction L2 on the outer area of the electrical conductor track 121 facing away from the carrier 1, wherein the electrical contact material 122 is arranged between the connection area 13 and the conductor track 121 in a vertical direction V.

Figure 2A:
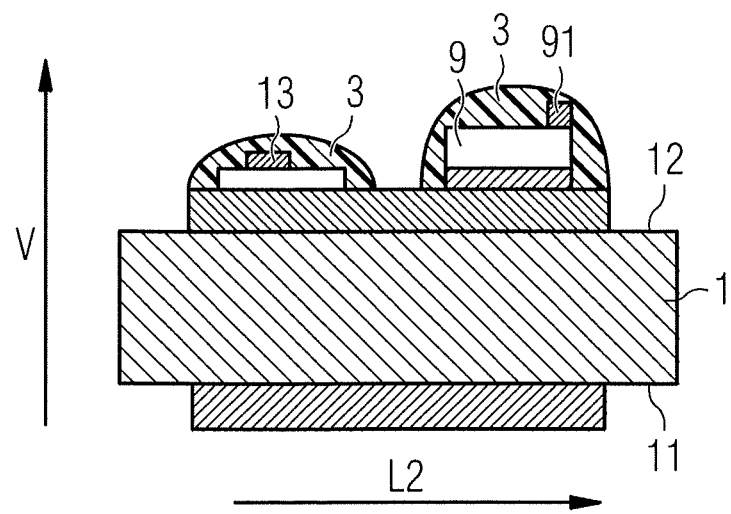
FIG. 2A show individual manufacturing steps for producing an example by our method.

FIG. 2A shows, in a next step c), the carrier 1 once again along the lateral direction L2, wherein a radiation-transmissive, electrically insulating material 3 is applied to all exposed places of the connection area 13, of the electrical contact material 122 and also to the electronic element 9 and the contact area 91. By way of example, the application can be effected by dispensing, jetting or potting. The electrically insulating material 3 is free of foreign particles 42 of a filler 41. In this case, the electrically insulating material 3 is formed with a silicone.

Figure 2B:
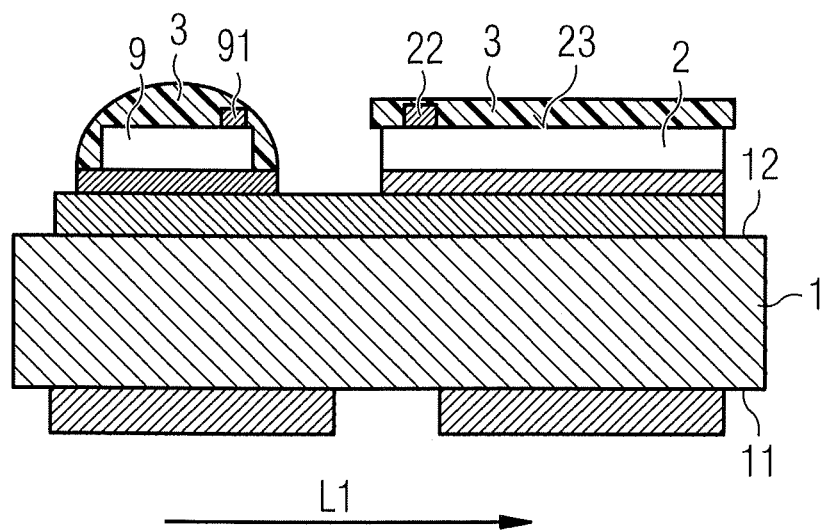
FIG. 2B show individual manufacturing steps for producing an example by our method.

FIG. 2B shows the carrier 1 along the lateral direction L1, wherein a radiation passage area 23 of the optoelectronic component 2, the contact area 22 of the optoelectronic component 2 and all exposed places of the electronic element 9 and of the contact area 91 are completely covered by the electrically insulating layer 3.

Figure 3A:
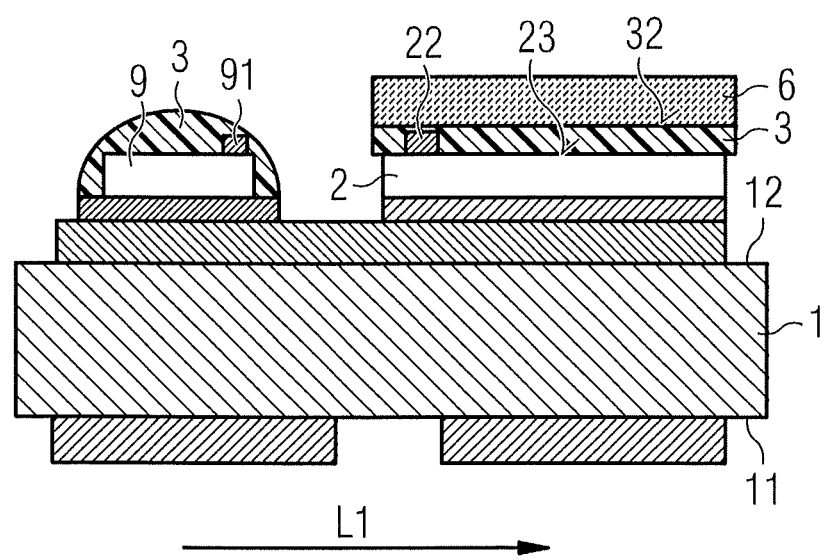
FIG. 3A show individual manufacturing steps for producing an example by our method.

FIG. 3A shows that, in a next step, a conversion layer 6 is applied to an outer area 32 of the electrically insulating material 3 facing away from the optoelectronic component 2.

FIG. 4A illustrates how, in a next step d), an electrically insulating layer 4 is applied completely to all exposed places of the electrically insulating material 3, of the optoelectronic component 2 and also to an area at the top side 12 of the carrier 1. Preferably, the electrically insulating layer 4 covers the aforementioned places in a positively locking manner. The electrically insulating layer comprises foreign particles 42 of the filler 41. In this case, the electrically insulating layer is formed with a matrix material such as, for example, a silicone, an epoxide or a mixture composed of silicone an epoxide, into which matrix material the filler 41 is introduced in a predefinable concentration. In the example shown in FIG. 4A, the filler 41 is a radiation-reflective material, wherein the foreign particles 42 are radiation-reflective particles which can be formed in particular with $TiO_2$. In other words, the electrically insulating layer 4 appears white to an external observer. In this case, the electronic element 9 and also those places of the carrier 1 and of the optoelectronic component 2 covered by the electrically insulating layer 4 are completely hidden. In a vertical direction V, the electrically insulating layer 4 terminates flush with the conversion layer 6. In this case, an outer area 62 of the conversion layer 6 facing away from the optoelectronic component 2 is free of the electrically insulating layer 4.

FIG. 4B shows an assemblage illustrated in FIG. 4A and consisting of the carrier 1, the optoelectronic component 2, the electronic element 9 and also the electrically insulating material 3 and the electrically insulating layer 4 along the lateral direction L2. It can be discerned in FIG. 4B that the connection area 13 is likewise covered completely by the electrically insulating material 3 in a positively locking manner, wherein in this case, too, all exposed places of the electrically insulating material 3 are covered by the electrically insulating layer 4 in a positively locking manner.

Figure 5A:
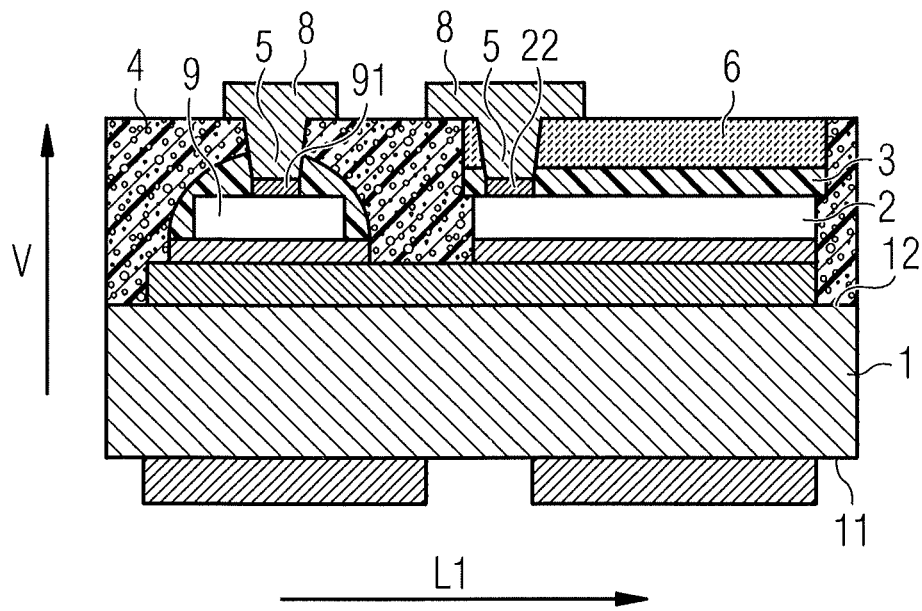
FIG. 5A show individual manufacturing steps for producing an example by our method.

FIG. 5A illustrates further steps e) and f), wherein first in a vertical direction V both above the contact area 22 of the optoelectronic component 2 and above the contact area 91 of the electronic element 9, the electrically insulating material 3 and the electrically insulating layer 4 are removed. Through the openings 5, the contact areas 22 and 91 are free of the electrically insulating layer 4 and the electrically insulating material 3 at least in places. In the next step f), electrically conductive material 8 is arranged in the openings 5, the electrically conductive material 8 completely filling the openings 5. It can furthermore be discerned that the electrically conductive material 8 is arranged in places on an outer area of the electrically insulating layer 4 facing away from the carrier 1. After carrying out steps e) and f), an optoelectronic semiconductor component 100 can be produced.

Figure 5B:
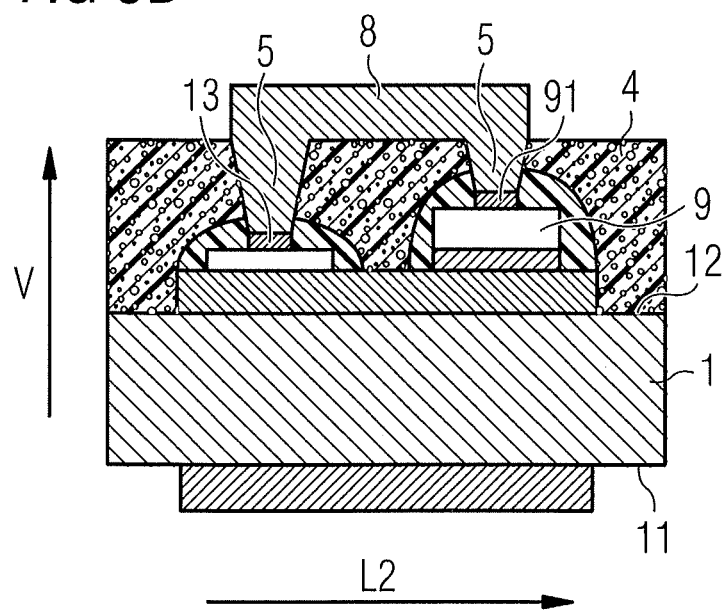
FIG. 5B show individual manufacturing steps for producing an example by our method.

The optoelectronic semiconductor component 100 illustrated in FIG. 5A is illustrated along the lateral direction L2 in FIG. 5B. In this case, it can be discerned that an opening 5 is likewise introduced in a vertical direction V above the connection area 13 through the electrically insulating layer 4 and the electrically insulating material 3. The electrically conductive material 8 is arranged in the opening 5, wherein in this case, too, the electrically conductive material 3 completely fills the opening 5 introduced above the connection area 13.

Figure 5C:
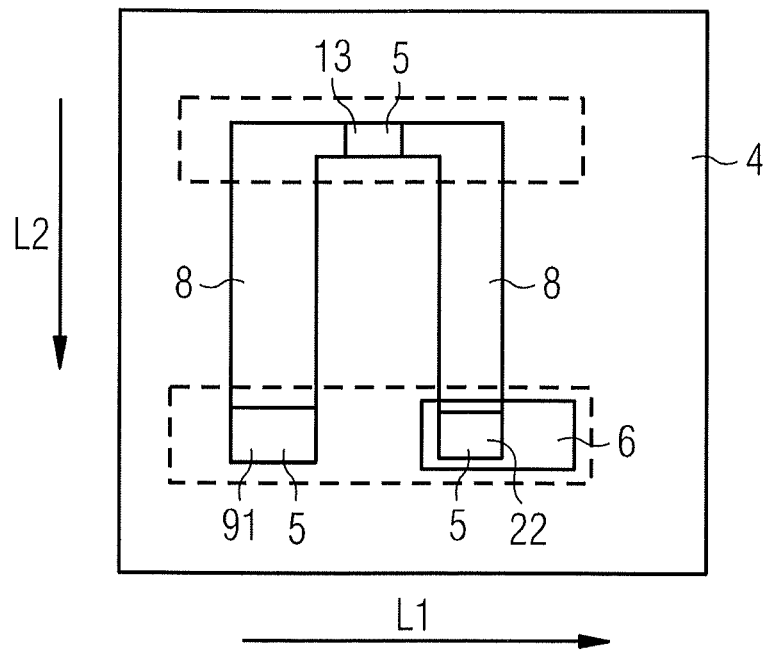
FIG. 5C show individual manufacturing steps for producing an example by our method.

The semiconductor component 100 illustrated in FIGS. 5A and 5B is illustrated in a schematic plan view in FIG. 5C. It can be discerned that the electrically conductive material 8 electrically contact-connects both the contact area 91 of the electronic element 9 and the contact area 22 of the optoelectronic component 2 in each case to the connection area 13 and runs continuously in a lateral direction L2 between the connection area 13 and the two contact areas 22 and 91.

Figure 6:
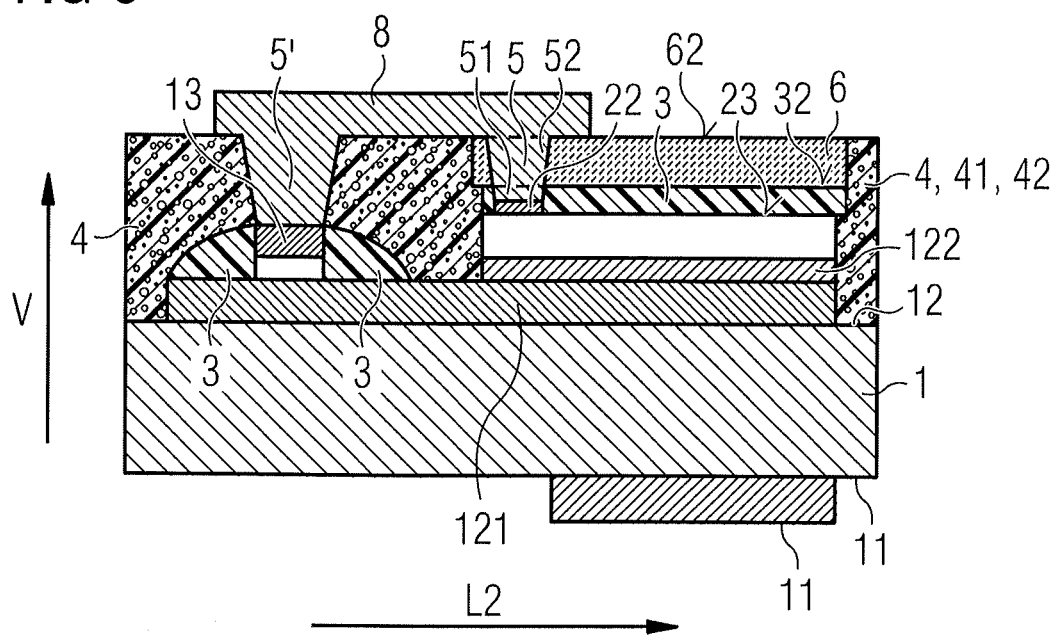
FIG. 6 shows in a schematic side view an example of an optoelectronic semiconductor component.

FIG. 6 illustrates the semiconductor component 100 in a lateral sectional view along the lateral direction L2. The optoelectronic semiconductor component 100 comprises the carrier 1 having the top side 12 and also the underside 11 situated opposite the top side 12. Furthermore, the optoelectronic semiconductor component 100 comprises the connection area 13 arranged at the top side 12. The contact layer 122 is applied on the outer area of the conductor track 121 facing away from the carrier 1. The optoelectronic component 2 is applied to the contact layer 122. The optoelectronic component 2 has a contact area 22 facing away from the carrier 1.

Furthermore, the electrically insulating material 3 is applied to the radiation passage area 23 of the optoelectronic component 2 and completely covers the radiation passage area 23. Furthermore, it can be discerned in FIG. 6 that the conversion layer 6 is applied to the outer area 32 of the electrically insulating material 3 facing away from the optoelectronic component 2.

As a result of a material opening 51 introduced into the electrically insulating material 3 above the contact area 22, the contact area 22 is free of the electrically insulating material 3 at least in places. Furthermore, a layer opening 52 is introduced into the conversion layer 6 in a vertical direction V above the material opening 51, the layer opening being congruent with the material opening 51 in a vertical direction V. A contiguous and continuous opening 5 is formed by the layer opening 51 and the material opening 52. Furthermore, a further opening 5' is introduced into the electrically insulating layer 4 and the electrically insulating material 3 in a vertical direction V above the connection area 13, such that in this case, too, the connection area 13 is free of the electrically insulating material 3 at least in places. The electrically conductive material 8 runs continuously at a side of the electrically insulating layer 4 facing away from the carrier 1 directly on the electrically insulating layer 4 in the lateral direction L2 between the contact area 22 and the connection area 13. In this case, the electrically conductive material 8 is arranged in the openings 5 and 5' and completely fills the latter. That is to say that the electrically conductive material 8 electrically conductively connects the contact area 22 to the connection area 13. The electrically insulating layer 4 is radiation-reflective or radiation-absorbent and terminates flush with the outer area 62 of the conversion layer 6 facing away from the carrier 1 in a vertical direction V, wherein the outer area 62 is free of the electrically insulating layer 4.

Our methods are not restricted by the description on the basis of the examples. Rather, this disclosure encompasses any novel feature and also any combination of features, which in particular includes any combination of features in the appended claims, even if the feature or combination itself is not explicitly specified in the claims or in the examples.

The invention claimed is:

1. A method of producing an optoelectronic semiconductor component comprising:
   a) providing a carrier having a top side, an underside situated opposite the top side, and at least one connection area arranged at the top side;
   b) applying at least one optoelectronic component to the top side, wherein the optoelectronic component has at least one contact area facing away from the carrier;
   c) applying an electrically insulating material to the contact area and the connection area, wherein the electrically insulating material is free of foreign particles of a filler;
   d) applying the electrically insulating material to a radiation passage area of the optoelectronic component at least in places, and the electrically insulating material is radiation-transmissive;
   e) applying at least one conversion layer to an outer area of the electrically insulating material facing away from the optoelectronic component;
   f) applying an electrically insulating layer to exposed places of the electrically insulating material of the optoelectronic component and of the carrier, wherein the electrically insulating layer comprises foreign particles of the filler with a predefinable concentration;
   g) removing the electrically insulating layer in a region above the contact area and/or the connection area to thereby produce openings;
   h) removing at least the electrically insulating material in a region above the contact area and the connection area, thereby producing at least two openings in the electrically insulating material; and
   i) arranging electrically conductive material on the electrically insulating layer and at least in places in the openings, wherein the electrically conductive material electrically conductively connects the contact area to the connection area,
   wherein the electrically insulating layer is radiation-reflective or radiation-absorbent, the electrically insulating layer is applied to exposed places of the optoelectronic component; of the electrically insulating material and of the conversion layer, and an outer area of the conversion layer facing away from the optoelectronic component remains free of the electrically insulating layer.

2. The method according to claim 1, wherein the electrically insulating material and the electrically insulating layer comprise an identical material.

3. The method according to claim 1, wherein the electrically insulating layer contains at least one luminescence conversion material.

4. The method according to claim 1, wherein the conversion layer is removed in the region above the contact area, whereby at least one of the openings is produced.

5. The method according to claim 1, wherein, in a vertical direction, the conversion layer terminates flush with the electrically insulating layer.

6. The method according to claim 1, wherein, before step c), at least one electronic element at the top side is arranged at the carrier in a manner spaced apart from the optoelectronic component in a lateral direction, and, after the electronic element has been arranged at the carrier, the electrically insulating material is first applied to exposed places of the electronic element and the electrically insulating layer is subsequently applied to exposed places of the electrically insulating material.

7. An optoelectronic semiconductor component comprising:
   a carrier having a top side, an underside situated opposite the top side, and also at least one connection area arranged at the top side;
   at least one optoelectronic component arranged at the top side and which has at least one contact area facing away from the carrier;
   an electrically insulating material applied on a radiation passage area of the optoelectronic component, wherein the electrically insulating material is free of foreign particles of a filler;
   an electrically insulating layer directly adjoining the electrically insulating material in a lateral direction, wherein the electrically insulating layer comprises foreign particles of the filler with a predefinable concentration and openings in the region above the contact area and/or the connection area; and
   a material opening introduced into the electrically insulating material above the contact area,
   wherein the contact area, in the region of the material opening, is free of the electrically insulating material at least in places,
   wherein at least one conversion layer is applied to an outer area of the electrically insulating material facing away from the optoelectronic component, the electrically insulating layer is radiation-reflective or radiation-absorbent, an outer area of the conversion layer facing away from the carrier is free of the electrically insulating layer, a layer opening introduced into the conversion layer is in a vertical direction at least in places congruent with the material opening introduced into the electrically insulating material, and the material opening and the layer opening together form an opening.

8. The optoelectronic semiconductor component according to claim 7, wherein a further opening is introduced above the connection area in the electrically insulating layer and the electrically insulating material, and the connection area is free of the electrically insulating material at least in places.

9. The optoelectronic semiconductor component according to claim 7, further comprising an electrically conductive material arranged in places at a side of the electrically insulating layer facing away from the carrier and at least in places in the openings and electrically conductively connects the contact area to the connection area.

10. An optoelectronic semiconductor component comprising:
- a carrier having a top side, an underside situated opposite the top side, and at least one connection area arranged at the top side;
- at least one optoelectronic component arranged at the top side and having at least one contact area facing away from the carrier;
- an electrically insulating material applied on a radiation passage area of the optoelectronic component, wherein the electrically insulating material is free of foreign particles of a filler;
- an electrically insulating layer directly adjoining the electrically insulating material in a lateral direction, wherein the electrically insulating layer comprises foreign particles of the filler with a predefinable concentration, marginally partly or completely encloses the electrically insulating material and/or the optoelectronic component and comprises openings in the region above the contact area and/or the connection area; and
- a material opening introduced into the electrically insulating material above the contact area, wherein the contact area, in the region of the material opening, is free of the electrically insulating material at least in places,
- wherein at least one conversion layer is applied to an outer area of the electrically insulating material facing away from the optoelectronic component, the electrically insulating layer is radiation-reflective or radiation-absorbent, an outer area of the conversion layer facing away from the carrier is free of the electrically insulating layer, a layer opening introduced into the conversion layer is in a vertical direction at least in places congruent with the material opening introduced into the electrically insulating material, and the material opening and the layer opening together form an opening.

* * * * *